United States Patent
Okazaki et al.

(10) Patent No.: US 9,294,040 B1
(45) Date of Patent: Mar. 22, 2016

(54) POWER AMPLIFIER AND TRANSMISSION DEVICE

(71) Applicant: PANASONIC CORPORATION, Osaka (JP)

(72) Inventors: Yukio Okazaki, Osaka (JP); Akinori Daimo, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/953,995

(22) Filed: Nov. 30, 2015

Related U.S. Application Data

(63) Continuation of application No. 14/537,921, filed on Nov. 11, 2014, now Pat. No. 9,231,526.

(30) Foreign Application Priority Data

Dec. 24, 2013  (JP) ................. 2013-265255

(51) Int. Cl.
*H03F 3/217* (2006.01)
*H03F 1/02* (2006.01)
*H03F 3/19* (2006.01)
*H03F 3/21* (2006.01)

(52) U.S. Cl.
CPC ............... *H03F 1/0205* (2013.01); *H03F 3/19* (2013.01); *H03F 3/211* (2013.01); *H03F 3/217* (2013.01); *H03F 2203/21139* (2013.01); *H03F 2203/21142* (2013.01)

(58) Field of Classification Search
USPC ................... 330/295, 251, 207 A, 302, 124 R
IPC .......................................................... H03F 3/217
See application file for complete search history.

(56) References Cited

U.S. PATENT DOCUMENTS

| | | | | |
|---|---|---|---|---|
| 3,546,698 A | * | 12/1970 | Kaltschmidt | ....... G01S 7/52003 342/157 |
| 5,113,145 A | * | 5/1992 | Ideler | ..................... H03F 3/2171 330/207 A |
| 5,223,800 A | * | 6/1993 | Karsten, Jr. | ............. H03F 3/602 330/124 R |

OTHER PUBLICATIONS

Sang-Min Yoo, et al.,"A Switched-Capacitor RF Power Amplifier", IEEE Journal of Solid-State Circuits, vol. 46, No. 12, Dec. 2011, pp. 2977-2987.

* cited by examiner

*Primary Examiner* — Patricia T Nguyen
(74) *Attorney, Agent, or Firm* — Greenblum & Bernstein, P.L.C.

(57) ABSTRACT

A power amplifier includes an output terminal, capacitive element groups including capacitive elements, and amplifier groups including amplifiers. Capacitive elements of the capacitive element groups are disposed on a first circle whose center is located on the output terminal. Amplifiers of the amplifier groups corresponding to the capacitive elements of the capacitive element groups are disposed on a second circle, which is concentric with and larger than the first circle. Each of the capacitive elements of the capacitive element groups is connected to both the output terminal and the corresponding amplifier of the amplifiers of the amplifier groups.

6 Claims, 4 Drawing Sheets

POWER AMPLIFIER AND TRANSMISSION DEVICE

CROSS-REFERENCE TO RELATED APPLICATIONS

This is a continuation of pending U.S. application Ser. No. 14/537,921, filed on Nov. 11, 2014, the disclosure of which is incorporated by reference herein in its entirety.

BACKGROUND

1. Technical Field

The present disclosure relates to a power amplifier and a transmission device which use a complementary metal-oxide semiconductor integrated circuit (CMOS-IC).

2. Description of the Related Art

An exemplary known power amplifier using a CMOS-IC is a switched capacitor power amplifier (SCPA) which achieves high efficiency (for example, see Sang-Min Yoo, Jeffrey S. Walling, Eum Chan Woo, Benjamin Jann, and David J. Allstot, "A Switched-Capacitor RF Power Amplifier", IEEE JOURNAL OF SOLID-STATE CIRCUITS, VOL. 46, No. 12, DECEMBER 2011). An SCPA which is a kind of class D amplifier performs amplitude modulation by changing the number of amplifiers switching between the power supply voltage and the ground (GND).

However, an SCPA of the related art fails to maximize the output power and the power efficiency. This problem will be described by using FIG. 1. FIG. 1 is a diagram illustrating an exemplary configuration of an SCPA of the related art.

In FIG. 1, the SCPA includes an output terminal 10, multiple capacitative elements (C) 11 to 15, and multiple amplifiers (AMP) 21 to 25. The capacitative elements 11 to 15 and the amplifiers 21 to 25 are disposed in such a manner as to be aligned in lines. In this configuration, the lengths of wiring from the amplifiers 21 to 25 to the output terminal 10 are different from each other. For example, the length of wiring from the amplifier 21 to the output terminal 10 is larger than that from the amplifier 23 to the output terminal 10. Therefore, the former wiring has larger parasitic capacitance and larger parasitic resistance. Accordingly, the output power and the power efficiency fail to be maximized.

SUMMARY

Thus, a non-limiting exemplary embodiment of the present disclosure provides an SCPA that achieves reduction in parasitic capacitance and parasitic resistance which are caused by the length of wiring and that achieves maximization of the output power and the power efficiency.

In one general aspect, the techniques disclosed here feature a power amplifier including an output terminal, multiple capacitative elements, and multiple amplifiers. The capacitative elements are disposed on a first circle whose center is located on the output terminal. The amplifiers correspond to respective capacitative elements, and are disposed on a second circle which is a concentric circle larger than the first circle. Each of the amplifiers is connected to a corresponding capacitative element and linearly aligned with the output terminal and the corresponding capacitative element. The amplifiers are configured to amplify an input signal by switching between connection to a power supply and connection to a ground, and to control an output amplitude by changing the number of the amplifiers.

In another general aspect, the techniques disclosed here feature a power amplifier including an output terminal, multiple capacitative elements, multiple amplifiers, and an inductor. The capacitative elements are disposed on a first circle whose center is located on the output terminal. The amplifiers correspond to respective capacitative elements, and are disposed on a second circle which is a concentric circle larger than the first circle. Each of the amplifiers is connected to a corresponding capacitative element and linearly aligned with the output terminal and the corresponding capacitative elements. The amplifiers amplify an input signal by switching between connection to a power supply and connection to a ground, and control an output amplitude by changing the number of connections to the power supply. The inductor is connected to the output terminal. The inductor and the capacitative elements constitute a resonant circuit.

These general and specific aspects may be implemented using a system, a method, and a computer program, and any combination of systems, methods, and computer programs.

According to the present disclosure, in an SCPA, parasitic capacitance and parasitic resistance which are caused by the length of wiring may be reduced and the output power and the power efficiency may be maximized. Additional benefits and advantages of the disclosed embodiments will be apparent from the specification and Figures. The benefits and/or advantages may be individually provided by the various embodiments and features of the specification and Figures, and need not all be provided in order to obtain one or more of the same.

DETAILED DESCRIPTION

Embodiments of the present disclosure will be described below in detail with reference to the drawings.

Output Power and Power Efficiency in an SCPA

Figure 1:
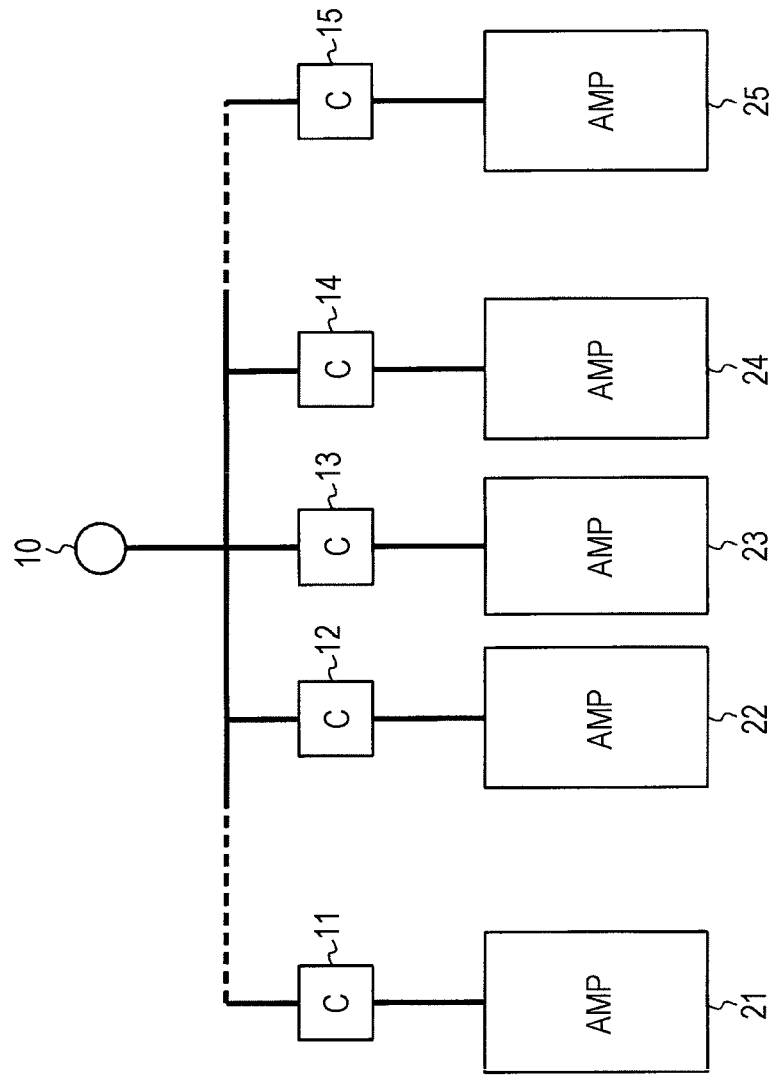
FIG. 1 is a diagram illustrating an exemplary configuration of an SCPA of the related art.
Figure 2:
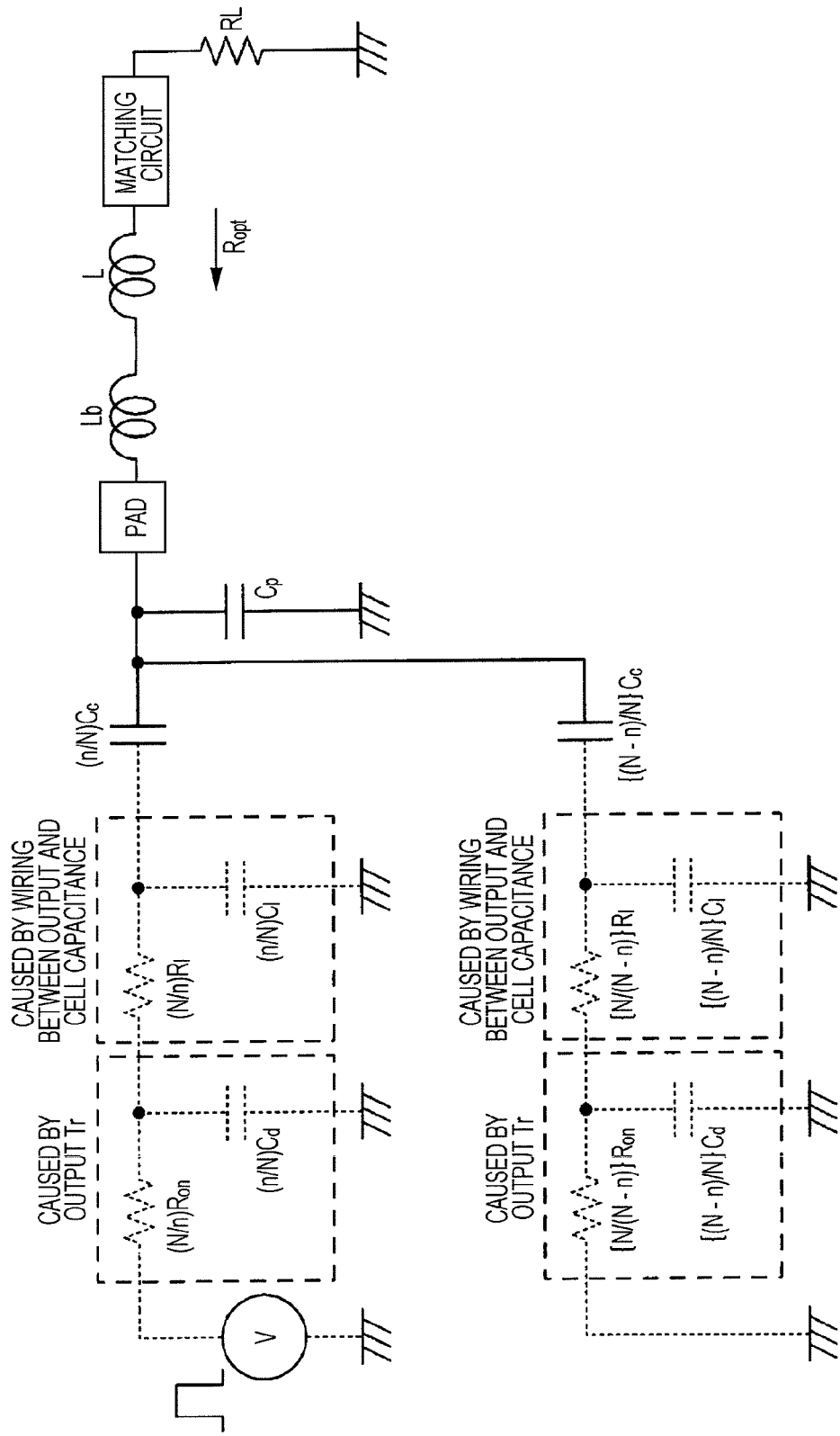
FIG. 2 is a diagram illustrating an exemplary equivalent circuit including parasitic capacitance and parasitic resistance in an SCPA of the related art.

Before description of the embodiments of the present disclosure, output power and power efficiency in an SCPA will be described by using FIG. 2. FIG. 2 illustrates an exemplary equivalent circuit including parasitic capacitance and parasitic resistance (parasitic elements) in an SCPA of the related art.

The circuit in FIG. 2 has N amplifiers and N capacitative elements ($C_c$) in total, and amplifiers, the number of which is n, among the N amplifiers are performing a switching operation (i.e., the n amplifiers are connected to a power supply V). Portions which are arranged on the left side of each of the capacitative elements in FIG. 2 and which are surrounded by a dashed line correspond to an amplifier. To simplify calculation described below, the distance of wiring between an amplifier and its corresponding capacitative element is the same as that between the capacitative element to a PAD (exemplary output terminal, and hereinafter referred to as a pad).

Symbols illustrated in FIG. 2 are as follows: $R_{ON}$ represents a value obtained by dividing the ON resistance of a MOS transistor by the number of amplifiers; $C_d$ represents a total of capacitances in the diffusion portions of the MOS transistors; $R_l$ represents a value obtained by dividing, by N, a parasitic resistance for the wiring between an amplifier and its corresponding capacitative element and between the capacitative element to the pad; $C_l$ represents a total of parasitic capacitances for N wires, each of which is connected between a corresponding one of the amplifiers and its corresponding capacitative element; $C_c$ represents a total of capacitances of the N capacitative elements; $C_p$ represents a total of parasitic capacitances of wires, each of which is connected between a corresponding one of the capacitative elements and the pad; Lb represents an inductor of bonding wires in the package; L represents a resonant inductor; $R_{opt}$ represents an output impedance before matching performed by a matching circuit; and RL represents a load.

In the configuration in FIG. 2, an output power $P_{out}$ may be obtained by using Expression (1) described below.

$$P_{out} = \frac{2}{\pi^2} \frac{R_{opt}}{\left\{R_{opt} + \frac{N}{n}(R_{on} + R_l)\right\}^2} \left(\frac{n}{N}\right)^2 \left(\frac{C_c}{C_c + C_p}\right)^2 V_{DD}^2 \quad (1)$$

A power efficiency η may be obtained from the output power $P_{out}$ and a power required to charge/discharge the capacitances $C_d$, $C_l$, $C_c$, and $C_p$ by using Expression (2) described below.

$$\eta = \frac{4n^2 C_c^2}{4n^2(C_c + C_p)^2 + 2\pi^2 f(C_c + C_p)\left\{R_{opt} + \frac{N}{n}(R_{on} + R_l)\right\}} \quad (2)$$
$$[n(N-n)C_c^2 + nN\{C_c C_p + (C_d + C_l)\}]$$

According to Expressions (1) and (2), the smaller the parasitic resistances $R_{ON}$ and $R_l$ and the capacitance values $C_d$, $C_l$, and C, are, the larger the output power $P_{out}$ and the power efficiency η are. Therefore, for amplifiers, capacitative elements, and a pad on an IC chip, a layout which reduces the parasitic capacitance and the parasitic resistance is required.

Accordingly, in SCPAs according to first to fourth embodiments described below, wiring is made between an amplifier to its corresponding capacitative element and between the capacitative element and the pad in such a manner that the distances are the shortest, resulting in reduction in the parasitic capacitance and the parasitic resistance and maximization of the output power and the power efficiency.

First Embodiment

Figure 3:
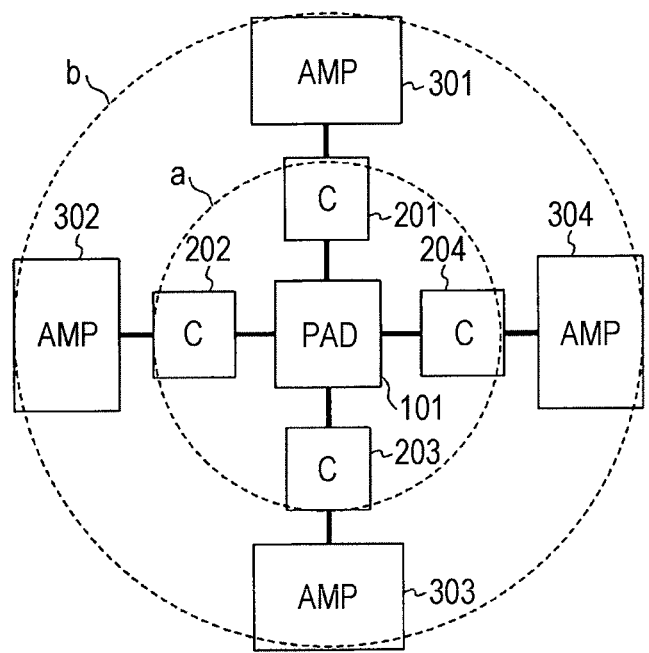
FIG. 3 is a diagram illustrating an exemplary configuration of an SCPA according to a first embodiment of the present disclosure.

FIG. 3 is a diagram illustrating a configuration example of the SCPA according to the first embodiment of the present disclosure.

In FIG. 3, the SCPA includes a pad (PAD) 101, multiple capacitative elements (C) 201 to 204, and multiple amplifiers (AMP) 301 to 304. The capacitative elements 201 to 204 correspond to the amplifiers 301 to 304, respectively, in a one-to-one manner.

Each of the amplifiers 301 to 304 receives a phase modulated signal, and the number of operating amplifiers is changed through an amplitude modulation signal which is separately supplied, whereby the amplitude of the phase modulated signal is modulated, and vector modulation is performed. In this case, the amplifiers 301 to 304 switch between connection to the power supply and connection to the ground, thereby amplifying the signal. The number of connections is changed, whereby the output amplitude is controlled. The amplified signal is output from each of the amplifiers 301 to 304 via a corresponding one of the capacitative elements 201 to 204 to the pad 101.

In FIG. 3, as an example, the number of capacitative elements is four and the number of amplifiers is four. However, the present disclosure is not limited to these. The number of capacitative elements and the number of amplifiers are preferably, for example, a power of 2 from the viewpoint of easy layout on an IC chip.

In FIG. 3, as an example, a pad is used as an output terminal. However, the present disclosure is not limited to this. In addition, the pad 101 is connected to a matching network (matching circuit) as in FIG. 2, which is not illustrated in FIG. 3. Therefore, a signal which is input to the pad 101 is output to the matching network via the bonding wire Lb and a lead frame (not illustrated).

In the SCPA according to the first embodiment, the pad 101, the capacitative elements 201 to 204, and the amplifiers 301 to 304 are disposed on an IC chip (not illustrated) as illustrated in FIG. 3. That is, the capacitative elements 201 to 204 are disposed on a circle a (exemplary first circle) whose center is located on the pad 101. The amplifiers 301 to 304 are disposed on a circle b (exemplary second circle) which is a concentric circle of the circle a. The pad 101, the capacitative element 201, and the amplifier 301 are aligned in a line. Similarly to this, the pad 101, the capacitative element 202, and the amplifier 302 are aligned in a line; the pad 101, the capacitative element 203, and the amplifier 303 are aligned in a line; and the pad 101, the capacitative element 204, and the amplifier 304 are aligned in a line. The linear alignment causes the distance of wiring between an amplifier and its corresponding capacitative element and that between the capacitative element and the pad to be the shortest.

As described above, in the SCPA according to the first embodiment, the capacitative elements are disposed on the circle a whose center is located on the output terminal; the amplifiers are disposed on the circle b which is a concentric circle of the circle a; and the output terminal, each of the capacitative elements, and a corresponding one of the amplifiers are aligned in a line. Thus, the distance of wiring between an amplifier to its corresponding capacitative element and that between the capacitative element and the output terminal may be the shortest. Therefore, in the SCPA according to the first embodiment, parasitic capacitance and parasitic resistance caused by the length of wiring may be reduced, enabling the output power and the power efficiency to be maximized.

Second Embodiment

Figure 4:
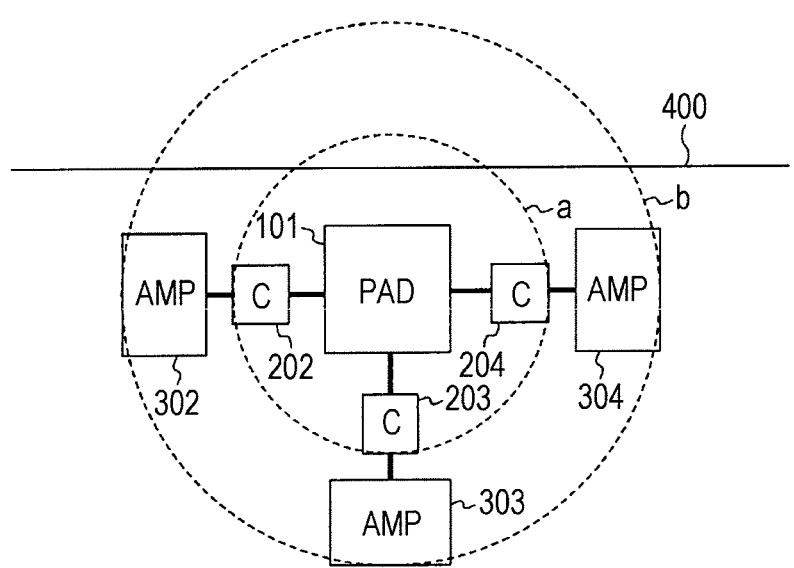
FIG. 4 is a diagram illustrating an exemplary configuration of an SCPA according to a second embodiment of the present disclosure.

FIG. 4 is a diagram illustrating a configuration example of the SCPA according to the second embodiment of the present disclosure. In FIG. 4, the same components as those in FIG. 3 are designated with identical reference numbers, and will not be described.

In FIG. 4, in the circles a and b, no capacitative elements and no amplifiers are disposed in a portion which protrudes from an IC chip end 400. For example, compared with FIG. 3, the capacitative element 201 and the amplifier 301 are not disposed in FIG. 4. Thus, the pad 101 is disposed near the IC chip end 400.

As described above, the SCPA according to the second embodiment may achieve the following effect in addition to the effect of the first embodiment. That is, in the SCPA according to the second embodiment, the capacitative elements and the pad are disposed in a portion which does not protrude from the IC chip end 400, in the circles a and b. Thus, the pad may be disposed near the IC chip end 400. Therefore, in the case of the configuration in FIG. 3, it is impossible to dispose the pad near the IC chip end 400, resulting in a long wire from the pad and difficult assembly. In contrast, in the configuration in FIG. 4, a wire with which the pad is connected to a lead frame (not illustrated) of the IC may be shortened, resulting in easy assembly.

Third Embodiment

Figure 5:
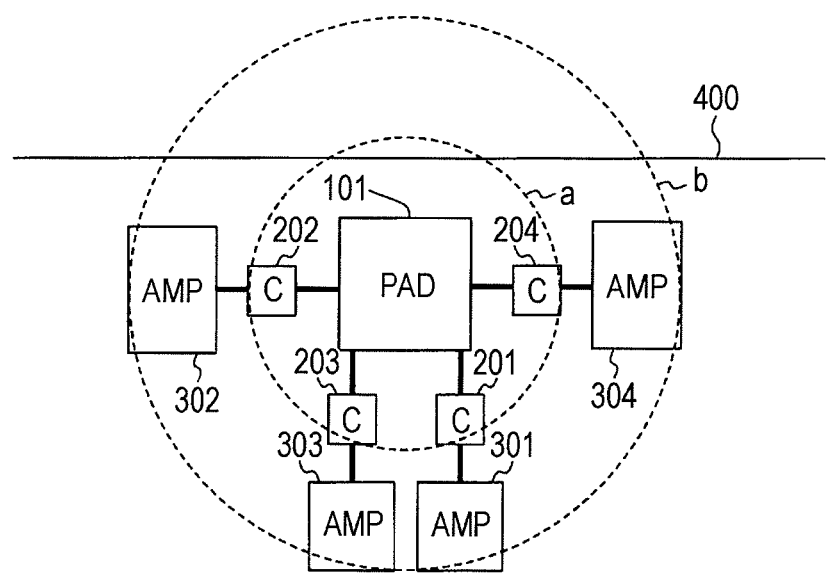
FIG. 5 is a diagram illustrating an exemplary configuration of an SCPA according to a third embodiment of the present disclosure.

FIG. 5 is a diagram illustrating a configuration example of the SCPA according to the third embodiment of the present disclosure. In FIG. 5, the same components as those in FIG. 4 are designated with identical reference numbers, and will not be described.

In the configuration in FIG. 5, similarly to that in FIG. 4, no capacitative elements and no amplifiers are disposed in a portion which protrudes from the IC chip end 400, in the circles a and b. The configuration in FIG. 5 is different from that in FIG. 4 in that the capacitative element 201 and the amplifier 301 are disposed adjacent to the capacitative element 203 and the amplifier 303. Thus, the pad 101 is disposed near the IC chip end 400, and the number of pairs of a capacitative element and an amplifier which are connected to the pad 101 may be a power of 2 (four in FIG. 5).

As described above, the SCPA according to the third embodiment may achieve the following effect in addition to the effects of the first and second embodiments. That is, in the SCPA according to the third embodiment, the number of pairs of a capacitative element and an amplifier which are disposed in a portion which does not protrude from the IC chip end, in the circles a and b is a power of 2. Thus, an amplitude control value for the SCPA is digitally represented. Typically, each bit which represents a power of 2 indicates the number of amplifiers and the number of capacitative elements. Therefore, the configuration in FIG. 5 is easily achieved.

Fourth Embodiment

Figure 6:
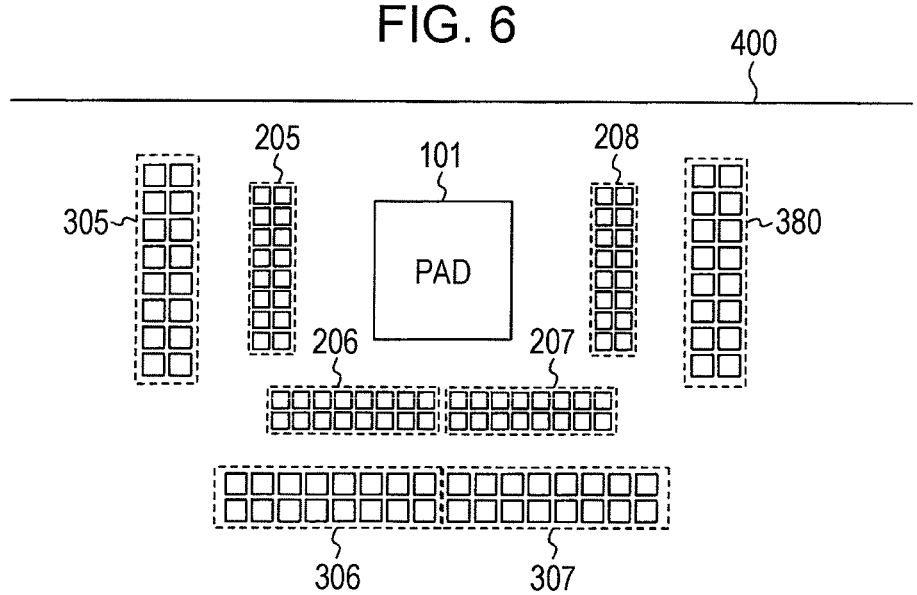
FIG. 6 is a diagram illustrating of an exemplary embodiment of an SCPA according to a fourth embodiment of the present disclosure.

FIG. 6 is a diagram illustrating a configuration example of the SCPA according to the fourth embodiment of the present disclosure. In FIG. 6, the same components as those in FIGS. 4 and 5 are designated with identical reference numbers, and will not be described.

FIG. 6 illustrates a configuration in which the total number of amplifiers is 64 (6 bits) and the total number of capacitative elements is 64 (6 bits). The total of the amplifiers and that of the capacitances are not limited to 64. In FIG. 6, similarly to FIGS. 4 and 5, capacitative element groups (groups of 16 capacitative elements) 205 to 208 are disposed on the circle a (not illustrated) whose center is located on the pad 101. In FIG. 6, similarly to FIGS. 4 and 5, amplifier groups (groups of 16 amplifiers) 305 to 308 are disposed on the circle b (not illustrated) which is a concentric circle of the circle a.

As described above, the SCPA according to the fourth embodiment may achieve the effect of the third embodiment.

The SCPAs according to the first to fourth embodiments as described above are mounted in a radio communication apparatus (transmission device, reception device) or the like which performs communication, for example, by using radio waves.

The first to fourth embodiments are not limited to the description above. Various modifications may be made without departing from the gist of the embodiments.

The present disclosure is suitable for use of an SCPA.

What is claimed:

1. A power amplifier comprising:
an output terminal;
a plurality of capacitive element groups that are disposed on a first circle whose center is located on the output terminal, each of the plurality of capacitive element groups comprises a plurality of capacitive elements; and
a plurality of amplifier groups that correspond to the plurality of capacitive element groups, and that are disposed on a second circle which is concentric with and larger than the first circle, each of the plurality of amplifier groups comprises a plurality of amplifiers,
wherein each of the plurality of capacitive elements in each of the plurality of capacitive element groups is connected to both the output terminal and a corresponding amplifier of the plurality of amplifiers in a corresponding amplifier group of the plurality of amplifier groups, and
the plurality of amplifiers in each of the plurality of amplifier groups are configured to amplify an input signal by switching between a connection to a power supply and a connection to ground, and to control an output amplitude by changing a number of the amplifiers in each of the plurality of amplifier groups.

2. A power amplifier comprising:
an output terminal;
a plurality of capacitive element groups that are disposed on a first circle whose center is located on the output terminal, each of the plurality of capacitive element groups comprises a plurality of capacitive elements;
a plurality of amplifier groups that correspond to the plurality of capacitive element groups, and that are disposed on a second circle which is concentric with and larger than the first circle, each of the plurality of amplifier groups comprises a plurality of amplifiers; and
an inductor connected to the output terminal, the inductor and the plurality of capacitive element groups constituting a resonant circuit,
wherein each of the plurality of capacitive elements in each of the plurality of capacitive element groups is connected to both the output terminal and a corresponding amplifier of the plurality of amplifiers in a corresponding amplifier group of the plurality of amplifier groups, and
the plurality of amplifiers in each of the plurality of amplifier groups are configured to amplify an input signal by switching between a connection to a power supply and a connection to ground, and to control an output amplitude by changing a number of the amplifiers in each of the plurality of amplifier groups.

3. The power amplifier according to claim 1, further comprising:
an IC chip on which the output terminal, the plurality of capacitive element groups, and the plurality of amplifier groups are mounted,
wherein the output terminal is disposed near an end of the IC chip,
the plurality of capacitive element groups are disposed on a portion of the first circle, which does not protrude from the end of the IC chip, and the plurality of amplifier groups are disposed on a portion of the second circle, which does not protrude from the end of the IC chip.

4. The power amplifier according to claim 1, further comprising:
- an IC chip on which the output terminal, the plurality of capacitive element groups, and the plurality of amplifier groups are mounted; and
- an inductor connected to the output terminal,
- wherein the output terminal is disposed near an end of the IC chip,
- the plurality of capacitive element groups are disposed on a portion of the first circle, which does not protrude from the end of the IC chip, and
- the plurality of amplifier groups are disposed on a portion of the second circle, which does not protrude from the end of the IC chip.

5. The power amplifier according to claim 1, wherein the number of the plurality of amplifiers in each of the amplifier groups is a power of 2.

6. A transmission device comprising the power amplifier according to claim 1.

* * * * *